(12) United States Patent
Kim et al.

(10) Patent No.: US 12,287,367 B2
(45) Date of Patent: Apr. 29, 2025

(54) TEST BOARD AND TEST DEVICE INCLUDING THE SAME

(71) Applicant: Samsung Electronics Co., Ltd., Suwon-si (KR)

(72) Inventors: Hyung Il Kim, Suwon-si (KR); Joo Sung Yun, Suwon-si (KR); Ki Jae Song, Suwon-si (KR); Sang Do Han, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 139 days.

(21) Appl. No.: 18/303,845

(22) Filed: Apr. 20, 2023

(65) Prior Publication Data
US 2023/0408576 A1 Dec. 21, 2023

(30) Foreign Application Priority Data

Jun. 16, 2022 (KR) .................. 10-2022-0073739

(51) Int. Cl.
*G01R 31/28* (2006.01)
*G01R 1/04* (2006.01)

(52) U.S. Cl.
CPC ....... *G01R 31/2863* (2013.01); *G01R 1/0466* (2013.01)

(58) Field of Classification Search
CPC .................. G01R 31/2863; G01R 1/0466
See application file for complete search history.

(56) References Cited

U.S. PATENT DOCUMENTS

| | | | | |
|---|---|---|---|---|
| 2001/0050567 A1* | 12/2001 | Bachelder | .......... | G01R 31/2863 324/750.2 |
| 2007/0252609 A1* | 11/2007 | Liang | .......... | G01R 1/0483 324/537 |
| 2009/0153168 A1* | 6/2009 | Beom | .......... | G01R 31/2893 414/222.01 |
| 2016/0377652 A1* | 12/2016 | Inoue | .......... | G01R 1/0433 324/756.02 |
| 2021/0132140 A1* | 5/2021 | Tsai | .......... | G11C 29/56 |

FOREIGN PATENT DOCUMENTS

| | | |
|---|---|---|
| KR | 10-2005-0003892 A | 1/2005 |
| KR | 10-2008-0046020 A | 5/2008 |
| KR | 102015395 B1 | 8/2019 |
| KR | 101974788 B1 | 9/2019 |
| KR | 10-2019-0131167 A | 11/2019 |
| KR | 10-2021-0105313 A | 8/2021 |

* cited by examiner

*Primary Examiner* — Eman A Alkafawi
*Assistant Examiner* — Suresh K Rajaputra
(74) *Attorney, Agent, or Firm* — Harness, Dickey & Pierce, P.L.C.

(57) ABSTRACT

A test board is provided. The test board comprises a first region which includes a first upper surface with first test sockets aligned thereon, and a first lower surface opposite to the first upper surface, a second region which includes a second upper surface with second test sockets aligned thereon, and a second lower surface opposite to the second upper surface, a hinge portion between the first region and the second region, and configured to connect the first region and the second region such that the first region and the second region are folded or unfolded, a first connector at one end of the first region opposite to the hinge portion and a second connector at one end of the second region opposite to the hinge portion.

20 Claims, 16 Drawing Sheets

FIG. 4
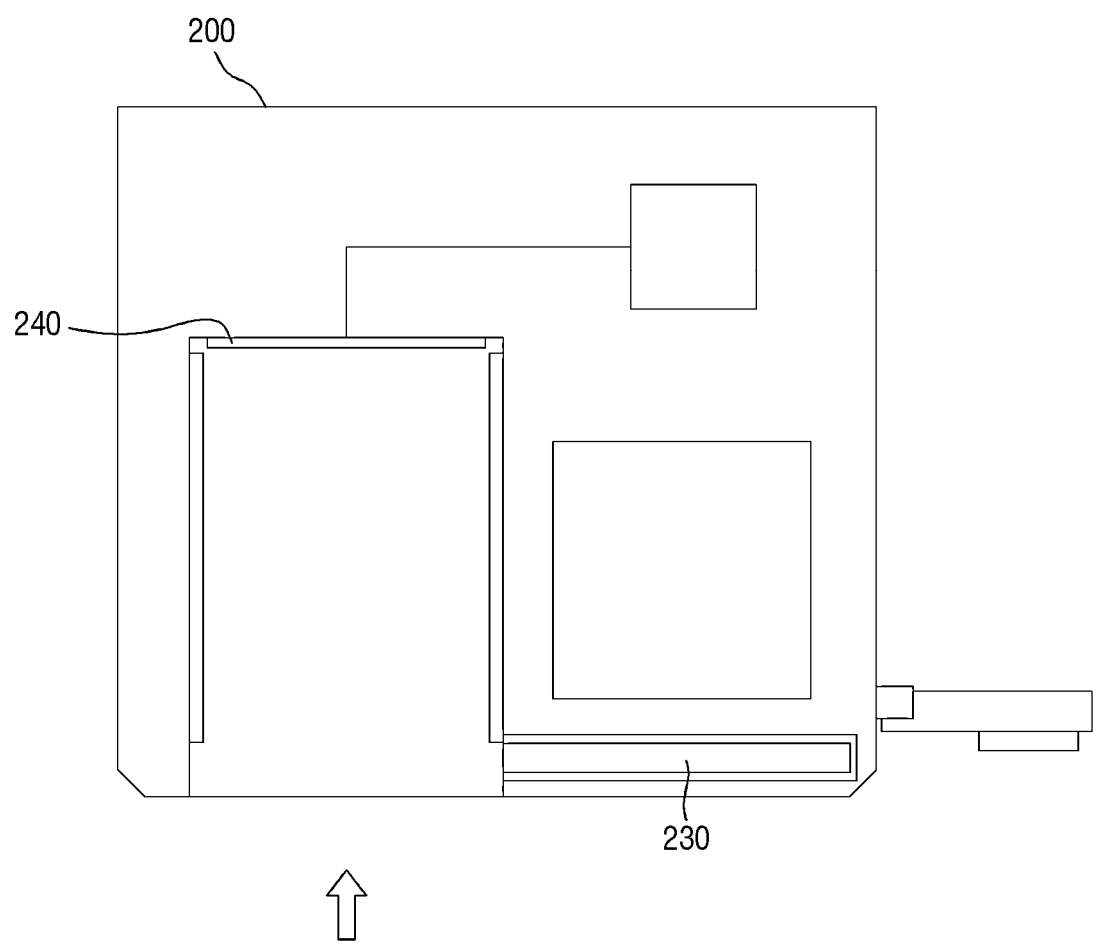
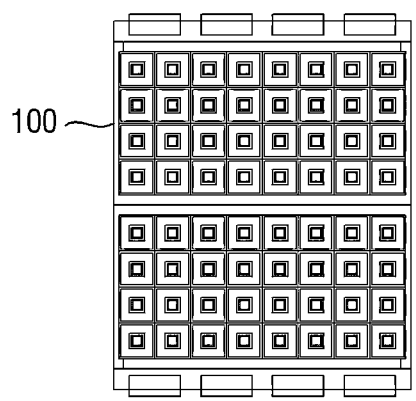

FIG. 5
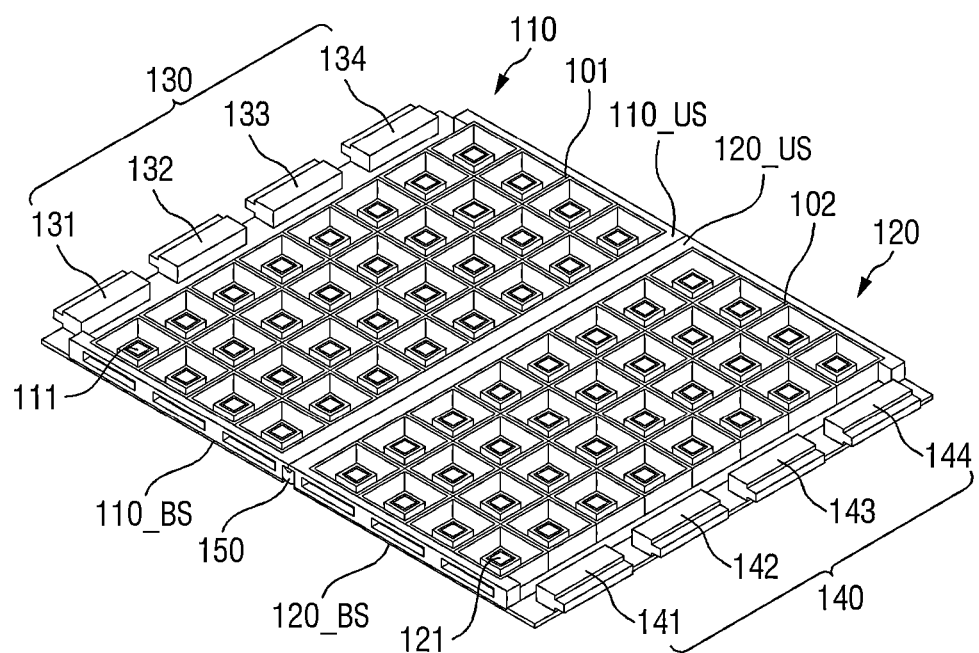
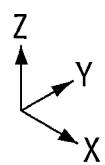

TEST BOARD AND TEST DEVICE INCLUDING THE SAME

CROSS-REFERENCE TO RELATED APPLICATION

This application claims priority from Korean Patent Application No. 10-2022-0073739 filed on Jun. 16, 2022, in the Korean Intellectual Property Office, and all the benefits accruing therefrom under 35 U.S.C. 119, the contents of which in its entirety are herein incorporated by reference.

BACKGROUND

1. Field of the Invention

The present inventive concepts relate to a test board and a test device including the same.

2. Description of the Related Art

A semiconductor device that has undergone a fabricating process performs a reliability test through various electrical operating tests. For example, a burn-in test is performed to test heat resistance of the semiconductor device. In the burn-in test, a severe stress such as a high temperature is applied to the semiconductor device to discriminate defective semiconductor devices. A test board electrically connected to the semiconductor device is used when the semiconductor device is mounted on or placed in a test apparatus.

SUMMARY

Aspects of the present inventive concepts provide a test board having improved test reliability.

Aspects of the present inventive concepts also provide a test device having improved test reliability.

According to some aspects of the present inventive concepts, there is provided a test board comprising a first region which includes a first upper surface with first test sockets aligned thereon, and a first lower surface opposite to the first upper surface, a second region which includes a second upper surface with second test sockets aligned thereon, and a second lower surface opposite to the second upper surface, a hinge portion between the first region and the second region, and configured to connect the first region and the second region such that the first region and the second region are folded or unfolded, a first connector at one end of the first region opposite to the hinge portion and a second connector at one end of the second region opposite to the hinge portion.

According to some aspects of the present inventive concepts, there is provided a test board comprising a first region in which first test sockets are aligned, a second region in which second test sockets are aligned, a hinge portion between the first region and the second region, configured to change an angle between the first region and the second region, and configured to connect the first region and the second region, a first connector at one end of the first region opposite to the hinge portion and a second connector at one end of the second region opposite to the hinge portion, wherein the angle between the first region and the second region is 0 degree or more and 180 degrees or less, the first connector is selectively connected to the second test sockets, and the second connector is selectively connected to the first test sockets.

According to some aspects of the present inventive concepts, there is provided a test device comprising a main body which includes a chamber configured to test a plurality of test target devices, and a test board configured to support the plurality of test target devices and mounted inside the chamber, wherein the test board includes a first region in which first test sockets connected to the test target devices are aligned, a second region in which second test sockets connected to the test target devices are aligned, a hinge portion between the first region and the second region, and configured to connect the first region and the second region such that the first region and the second region are folded or unfolded, a first connector at one end of the first region opposite to the hinge portion, and a second connector at one end of the second region opposite to the hinge portion.

However, aspects of the present inventive concepts are not restricted to the ones set forth herein. The above and other aspects of the present inventive concepts will become more apparent to one of ordinary skill in the art to which the present inventive concepts pertain by referencing the detailed description of the present inventive concepts given below.

BRIEF DESCRIPTION OF THE DRAWINGS

The above and other aspects and features of the present disclosure will become more apparent by describing in detail example embodiments thereof with reference to the attached drawings, in which:

FIGS. 1 to 4 are diagrams for explaining a test device according to some example embodiments.

FIGS. 5 to 7 are diagrams for explaining the test board according to some example embodiments.

DETAILED DESCRIPTION OF EXAMPLE EMBODIMENTS

Figure 1:
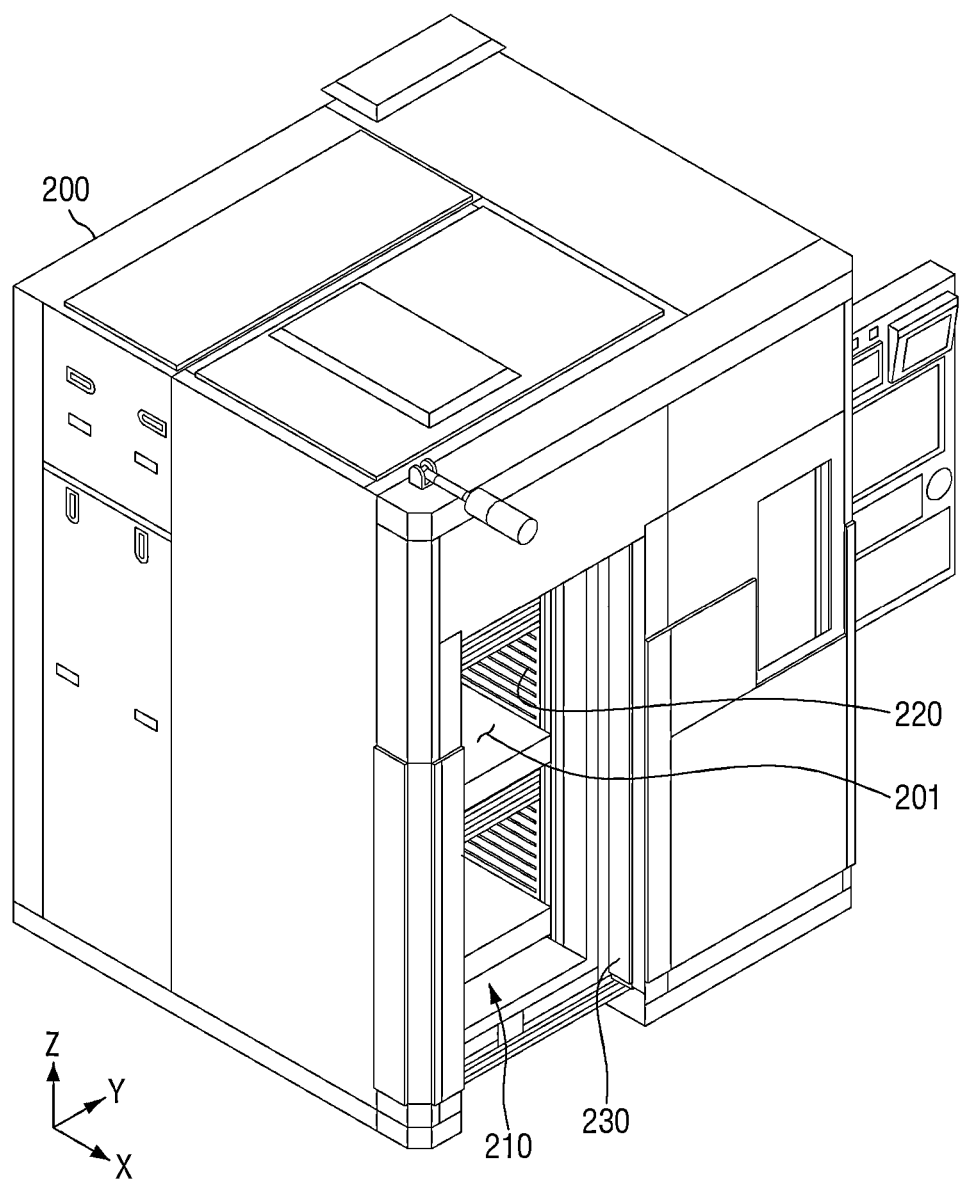
Figure 2:
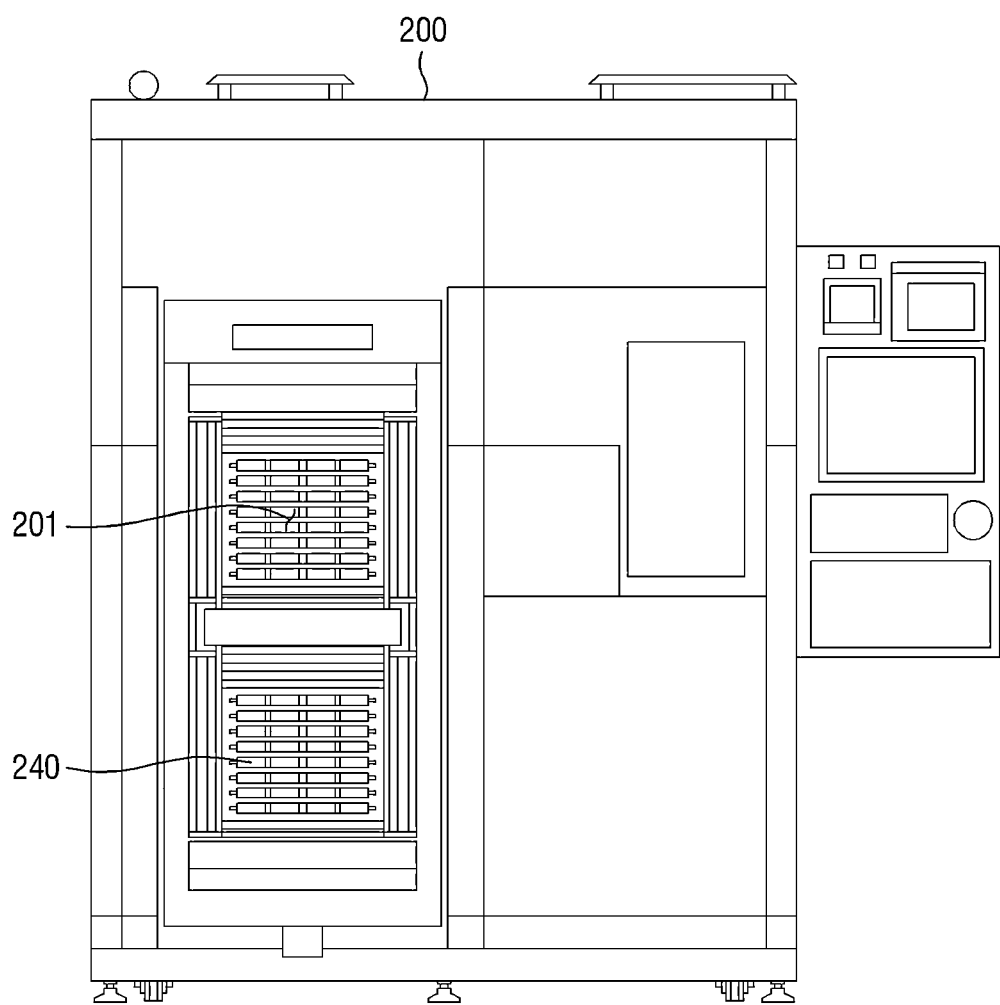
Figure 3:
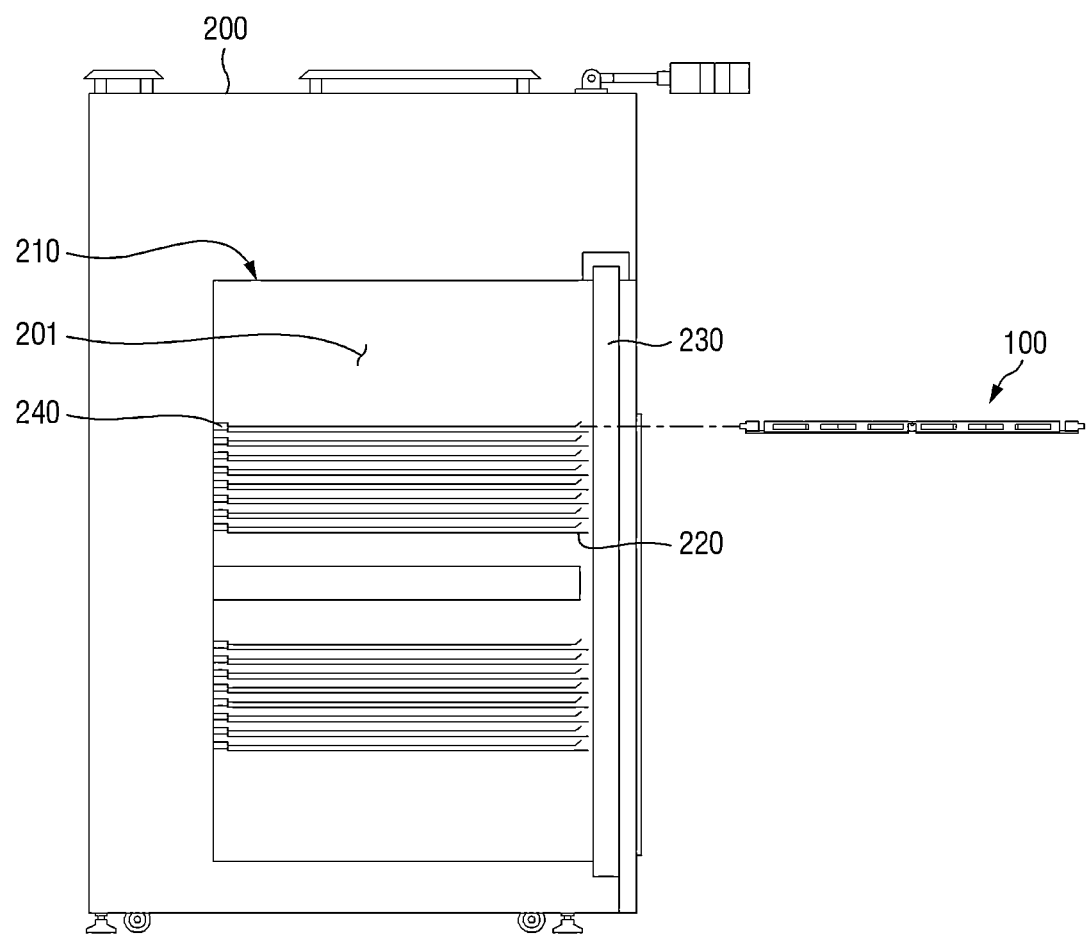

Hereinafter, example embodiments according to the technical concepts of the present inventive concepts will be described with reference to the accompanying drawings.

FIGS. 1 to 4 are diagrams for explaining a test device according to some example embodiments.

Referring to FIGS. 1 to 4, the test device according to some example embodiments includes a test board 100 and a main body 200.

The test board 100 may mount a test target device that is tested by the test device. The test board 100 may be mounted on or placed in an internal space 201 of a chamber 210. The test board 100 will be described in more detail below with reference to FIGS. 5 to 11.

The main body 200 may include a chamber 210, a plurality of support guides 220, a door 230 and/or a plurality of system connectors 240.

The chamber 210 may provide the internal space 201 in which the test is performed. The test board 100 may be mounted on or placed in the internal space 201 of the chamber 210.

The plurality of support guides 220 may be disposed in the internal space 201 of the chamber 210. For example, the plurality of support guides 220 may be disposed on the inner side walls of the chamber 210. For example, the plurality of support guides 220 may have a bar shape. The plurality of support guides 220 may support the test board 100 under the test board 100. However, example embodiments are not limited thereto. As another example, the plurality of support guides 220 may grip the test board 100 to fix the test board 100.

The door 230 may seal the internal space 201 of the chamber 210. For example, the door 230 may open and close the internal space 201 in a sliding manner.

The plurality of system connectors 240 may be disposed in the internal space 201 of the chamber 210. The plurality of system connectors 240 may be positioned on the inner side walls of the chamber 210 to be spaced apart from each other by the same interval. The plurality of system connectors 240 may be connected to the test board 100. The plurality of system connectors 240 may provide test signals to the test board 100. This will be described in more detail below with reference to FIGS. 12 to 15.

Figure 6:
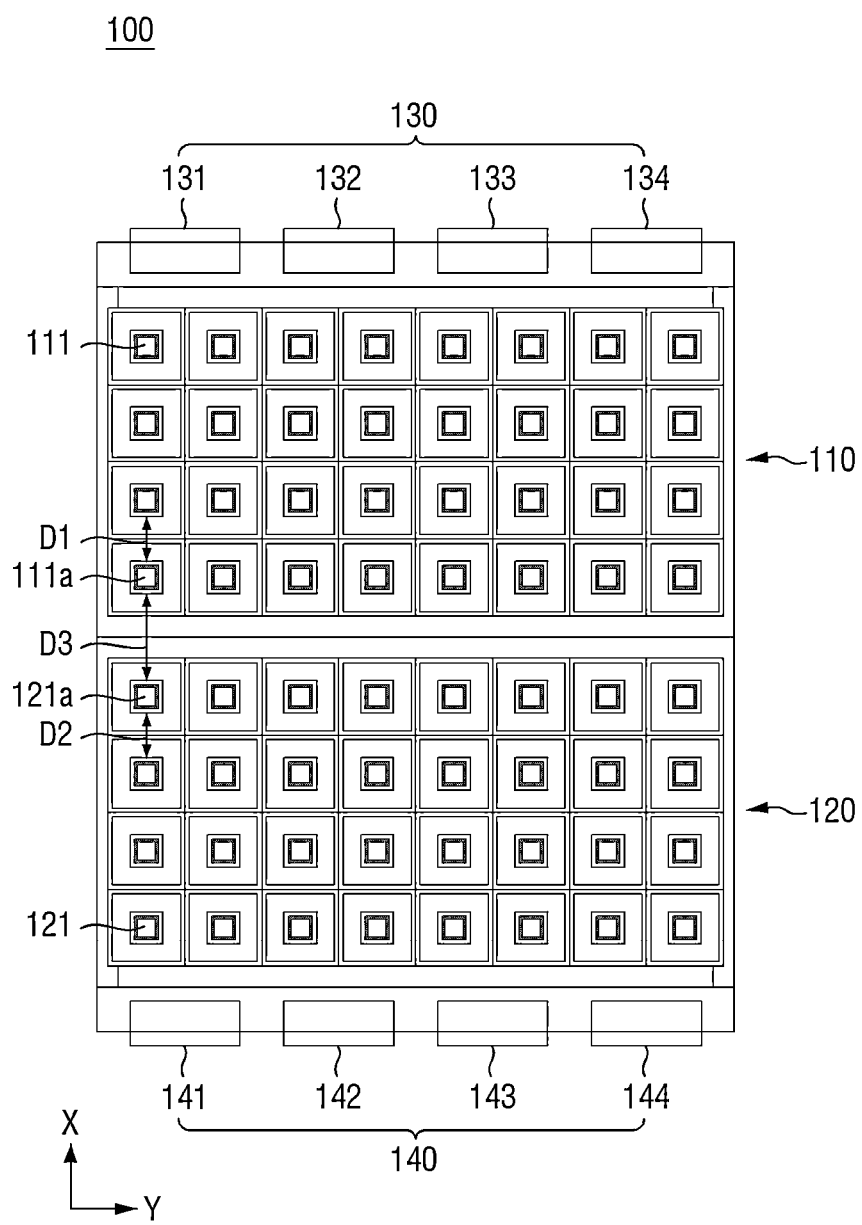
Figure 7:
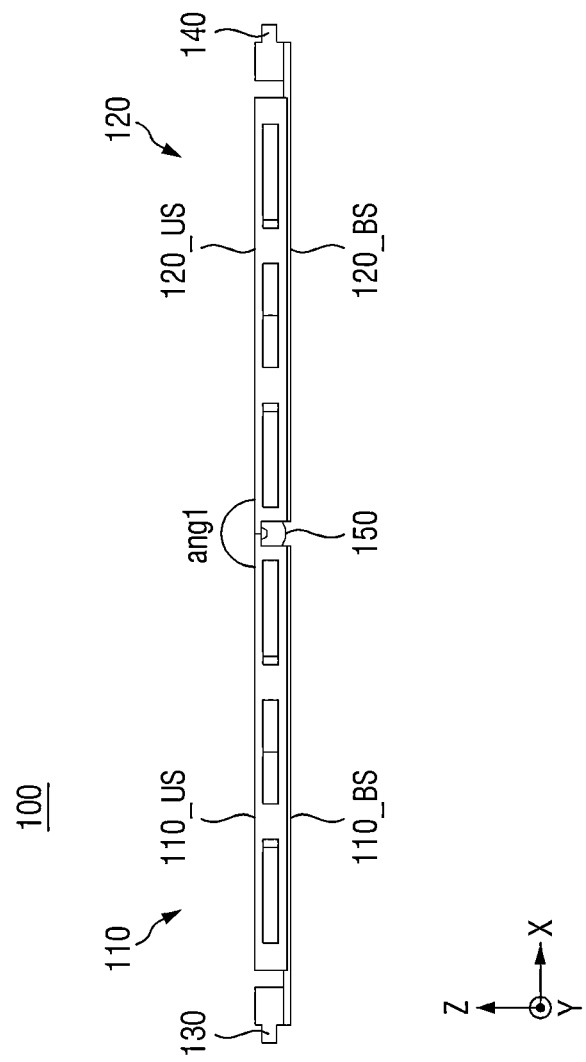

FIGS. 5 to 7 are diagrams for explaining the test board according to some example embodiments. For reference, FIGS. 5 to 7 show the test board 100 with a hinge portion 150 unfolded.

Referring to FIGS. 5 to 7, the test board 100 may include a first region 110, a second region 120, a first connector 130, a second connector 140, and/or a hinge portion 150.

The first region 110 and the second region 120 may be spaced apart from each other in a first direction X. The first region 110 and the second region 120 may be connected by the hinge portion 150.

The first region 110 may include a first upper surface 110_US and a first lower surface 110_BS. The first upper surface 110_US and the first lower surface 110_BS may be disposed to be opposite to each other in a third direction Z. A first frame 101 that separates a plurality of first test sockets 111 may be disposed on the first upper surface 110_US.

The first region 110 may include a plurality of first test sockets 111. The plurality of first test sockets 111 may be disposed inside the first frame 101. The plurality of first test sockets 111 may be aligned in the first region 110. For example, the plurality of first test sockets 111 may be repeatedly disposed in the first region 110 to be spaced apart from each other at regular intervals in the first direction X and the second direction Y.

The plurality of first test sockets 111 may be connected to a plurality of test target devices. The plurality of test target devices may be fastened or connected to the plurality of first test sockets 111. Although not shown, a fixing member that fixes the plurality of test target devices may be disposed in the first frame 101. For example, the plurality of first test sockets 111 may fix the plurality of test target devices that are mounted using an elastic member such as a spring.

The plurality of first test sockets 111 may be electrically connected with the first connector 130. The plurality of first test sockets 111 may be electrically connected with the second connector 140. For example, the plurality of first test sockets 111 may be selectively connected with the second connector 140.

The first connector 130 may be disposed at one end of the first region 110. For example, one end of the first region 110 in which the first connector 130 is disposed may be disposed to be opposite to the other end of the first region 110 connected to the hinge portion 150.

The first connector 130 may include a plurality of first sub-connectors 131 to 134. The plurality of first sub-connectors 131 to 134 may be disposed to be spaced apart in the second direction Y.

The second region 120 may include a second upper surface 120_US and a second lower surface 120_BS. The second upper surface 120_US and the second lower surface 120_BS may be disposed to be opposite to each other in the third direction Z. A second frame 102 that separates the plurality of second test sockets 121 may be disposed on the second upper surface 120_US.

The second region 120 may include the plurality of second test sockets 121. The plurality of second test sockets 121 may be disposed inside the second frame 102. The plurality of second test sockets 121 may be aligned in the second region 120. For example, the plurality of second test sockets 121 may be repeatedly disposed in the second region 120 to be spaced apart at regular intervals in the first direction X and the second direction Y.

The plurality of second test sockets 121 may be connected to the plurality of test target devices. The plurality of test target devices may be fastened or connected to the plurality of second test sockets 121. Although not shown, a fixing member that fixes the plurality of test target devices may be disposed inside the second frame 102.

The plurality of second test sockets 121 may be electrically connected to the second connector 140. The plurality of second test sockets 121 may be electrically connected to the first connector 130. For example, the plurality of second test sockets 121 may be selectively connected with the first connector 130.

The second connector 140 may be disposed at one end of the second region 120. For example, one end of the second region 120 in which the second connector 140 is disposed may be disposed opposite to the other end of the second region 120 connected to the hinge portion 150.

The second connector 140 may include a plurality of second sub-connectors 141 to 144. The plurality of second sub-connectors 141 to 144 may be disposed to be spaced apart in the second direction Y.

The hinge portion 150 may be disposed between the first region 110 and the second region 120. The hinge portion 150 may connect the first region 110 and the second region 120. The hinge portion 150 may be disposed below the first upper surface 110_US and the second upper surface 120_US. The hinge portion 150 may be disposed between the first lower surface 110_BS and the second lower surface 120_BS. For example, the first lower surface 110_BS of the first region 110 and the second lower surface 120_BS of the second region 120 may be spaced apart in the first direction X. The hinge portion 150 may be disposed in a space in which the first lower surface 110_BS and the second lower surface 120_BS are spaced apart from each other.

The hinge portion 150 may connect the first region 110 and the second region 120 such that the first region 110 and the second region 120 are folded. The hinge portion 150 may connect the first region 110 and the second region 120 such that the first region 110 and the second region 120 are unfolded. The hinge portion 150 may include a flexible printed circuit board (FPCB).

The hinge portion 150 may change an angle between the first region 110 and the second region 120. The hinge portion 150 may change the angle between the first region 110 and the second region 120 within the range of 0 degrees or more and 180 degrees or less. For example, as shown in FIGS. 5 to 7, a first angle (ang1) between the first region 110 and the second region 120 may be 180 degrees with the hinge portion 150 unfolded. That is, the first region 110 and the second region 120 may be oriented flat.

The first upper surface 110_US and the second upper surface 120_US come into contact with each other and may be connected in the first direction X, with the hinge portion 150 unfolded. The first lower surface 110_BS and the second lower surface 120_BS may be spaced apart from each other in the first direction X with the hinge portion 150 unfolded. The first connector 130 and the second connector 140 may be disposed symmetrically in the first direction X with the hinge portion 150 unfolded. The first connector 130 and the second connector 140 may be symmetrically disposed on the basis of the hinge portion 150.

Since the hinge portion 150 is disposed between the first region 110 and the second region 120, the distance between a first test socket 111 and a second test socket 121 may be different from a distance by which the plurality of first test sockets 111 are spaced apart, or a distance by which the second test sockets 121 are spaced apart.

For example, referring to FIG. 6, in the first region 110, the plurality of first test sockets 111 may be aligned to be spaced apart in the first direction X by a first interval D1. In the second region 120, the plurality of second test sockets 121 may be aligned to be spaced apart in the first direction X by a second interval D2. The first interval D1 and the second interval D2 may be equal to each other. That is, the spaced distance between the plurality of first test sockets 111 may be equal to the spaced distance between the plurality of second test sockets 121.

A first sub-test socket 111a among the plurality of first test sockets 111 may be disposed closest to the second region 120. A second sub-test socket 121a among the plurality of second test sockets 121 may be disposed closest to the first region 110. The first sub-test socket 111a and the second sub-test socket 121a may be adjacent to each other in the first direction X with the hinge portion 150 interposed therebetween. The first sub-test socket 111a and the second sub-test socket 121a may be spaced apart in the first direction X by a third interval D3. At this time, the third interval D3 may be greater than the first interval D1 and the second interval D2.

Figure 8:
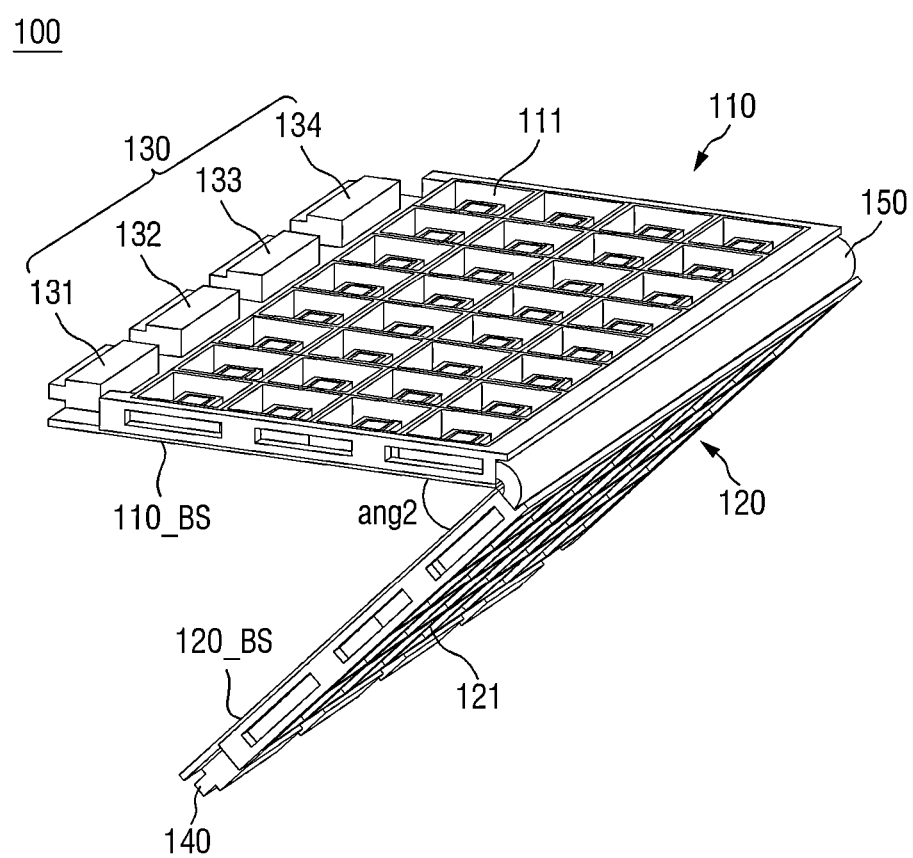
FIGS. 8 and 9 are diagrams for explaining modified forms of the test board according to some example embodiments.
Figure 9:
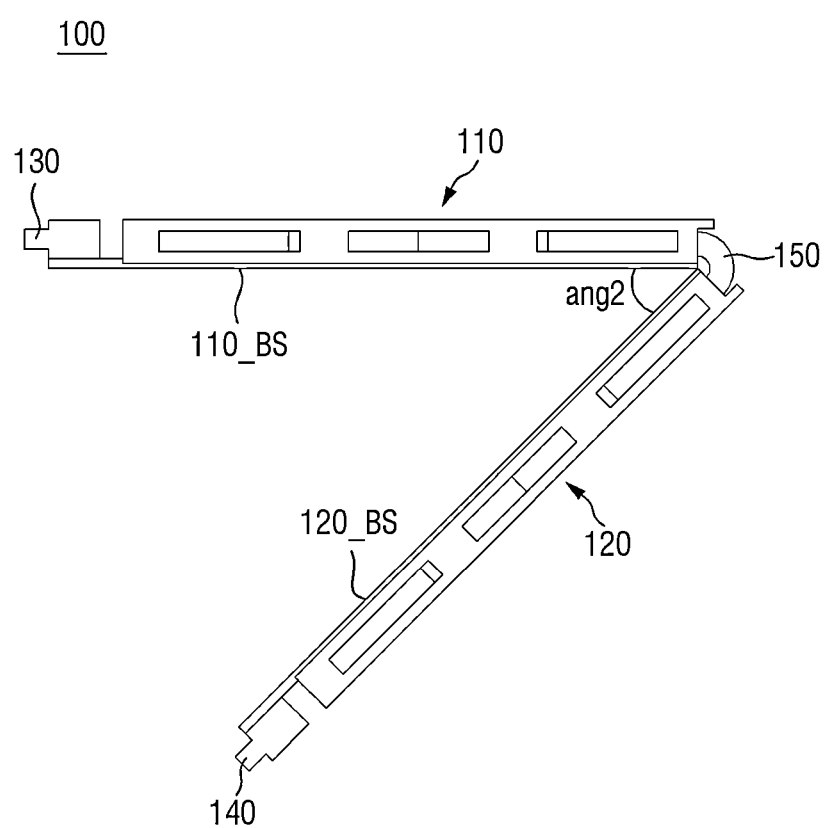

FIGS. 8 and 9 are diagrams for explaining modified forms of the test board according to some example embodiments. For reference, FIGS. 8 and 9 show the test board 100 with the hinge portion 150 partially folded.

Referring to FIGS. 8 and 9, the first region 110 and the second region 120 may form a second angle (ang2). At this time, the second angle (ang2) may be smaller than 180 degrees. The first region 110 and the second region 120 may not be connected or oriented flat with the hinge portion 150 folded. The first upper surface 110_US and the second upper surface 120_US may not come into contact with each other with the hinge portion 150 folded. The first upper surface 110_US and the second upper surface 120_US may be spaced apart from each other with the hinge portion 150 folded. The hinge portion 150 may be disposed in a space in which the first upper surface 110_US and the second upper surface 120_US are spaced apart.

Figure 10:
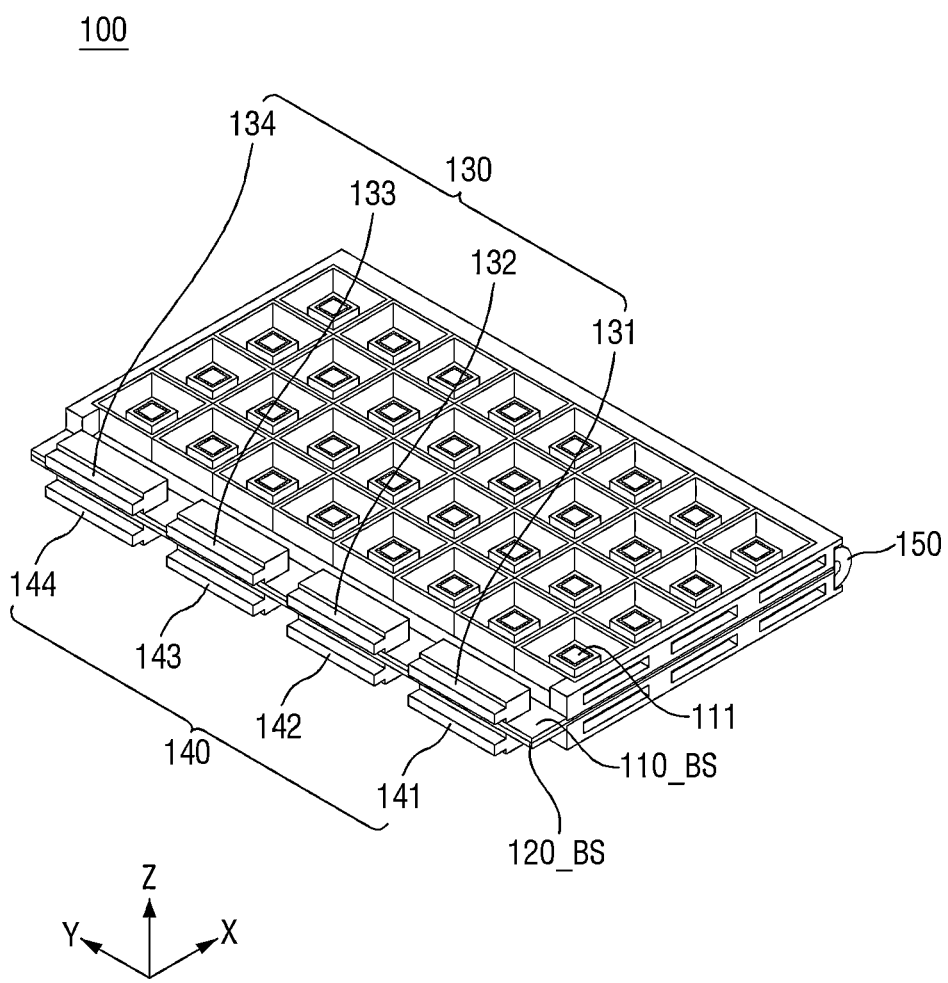
FIGS. 10 and 11 are diagrams for explaining a test board according to some example embodiments.
Figure 11:
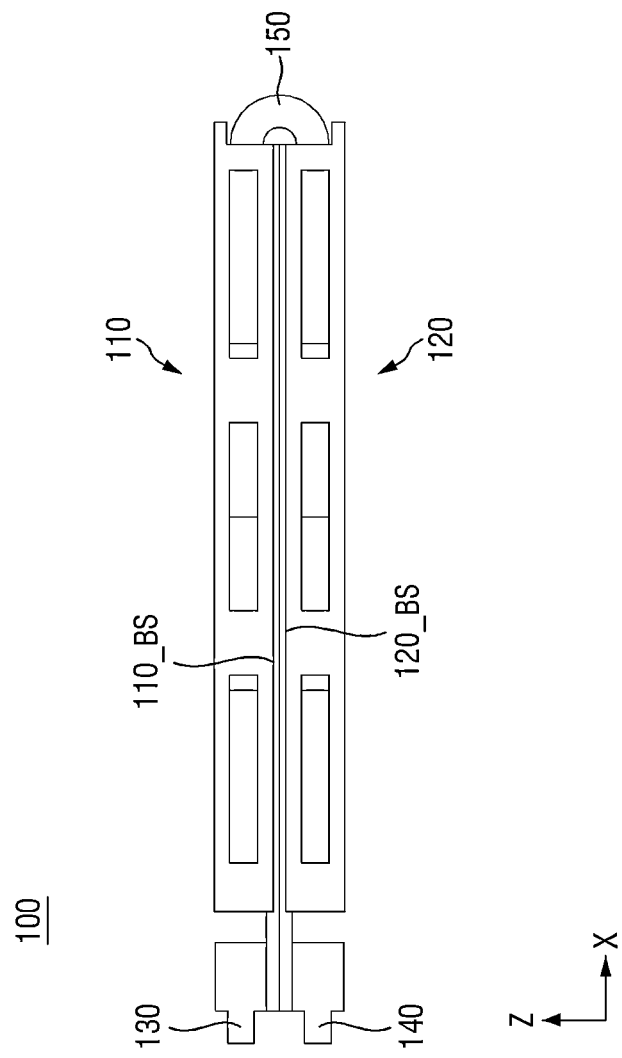

FIGS. 10 and 11 are diagrams for explaining a test board according to some example embodiments. For reference, FIGS. 10 and 11 show the test board 100 with the hinge portion 150 completely folded.

Referring to FIGS. 10 and 11, the first region 110 and the second region 120 may completely overlap. For example, the angle between the first region 110 and the second region 120 may be 0 degree with the hinge portion 150 completely folded.

The first upper surface 110_US and the second upper surface 120_US may be spaced apart in the third direction Z with the hinge portion 150 completely folded. The first lower surface 110_BS and the second lower surface 120_BS may completely come into contact with each other with the hinge portion 150 completely folded. The first connector 130 and the second connector 140 may be disposed in parallel with the hinge portion 150 completely folded. The first connector 130 and the second connector 140 may be disposed in parallel to be spaced apart in the third direction Z. The first connector 130 and the second connector 140 may be disposed at a position opposite to the hinge portion 150 in the first direction X with the hinge portion 150 completely folded.

Although the first lower surface 110_BS and the second lower surface 120_BS come into contact with each other in FIG. 11, the embodiments are not limited thereto. For example, the first upper surface 110_US and the second upper surface 120_US come into contact with each other, with the hinge portion 150 completely folded. In other words, the hinge portion 150 may fold such that the first upper surface 110_US and the second upper surface 120_US face each other.

FIGS. 12 to 15 are diagrams for explaining the operation of the test device according to some example embodiments.

Figure 12:
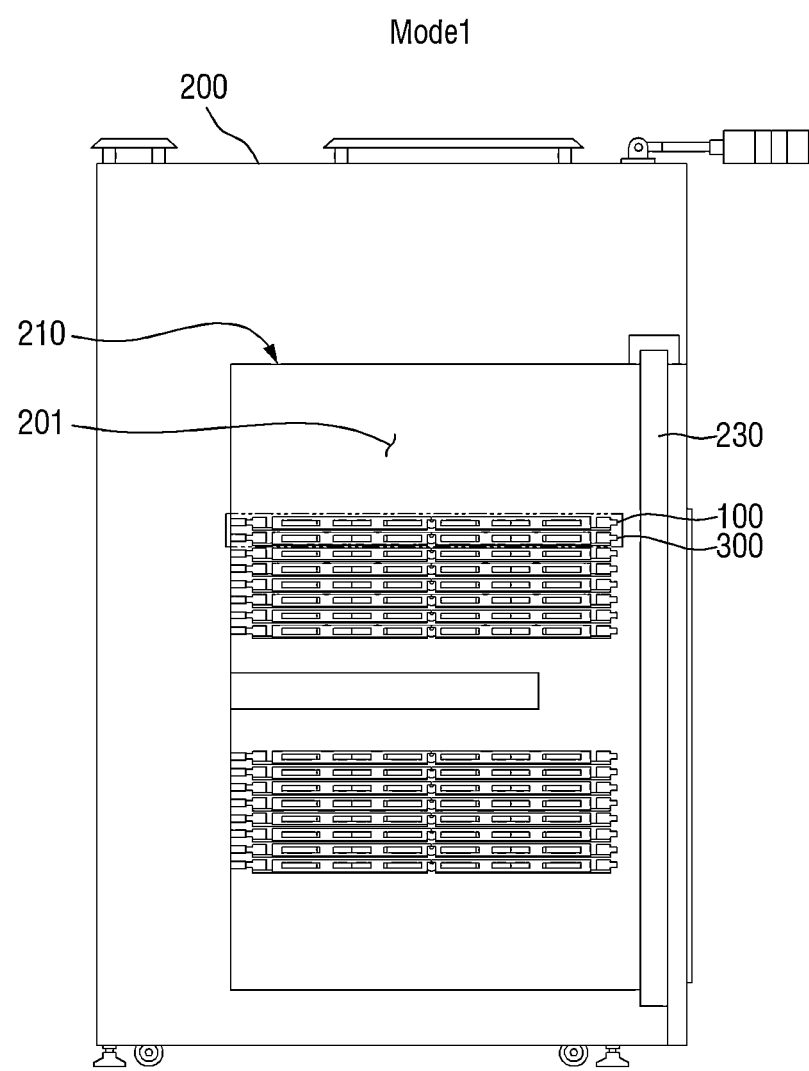
FIGS. 12 to 15 are diagrams for explaining the operation of the test device according to some example embodiments.
Figure 13:
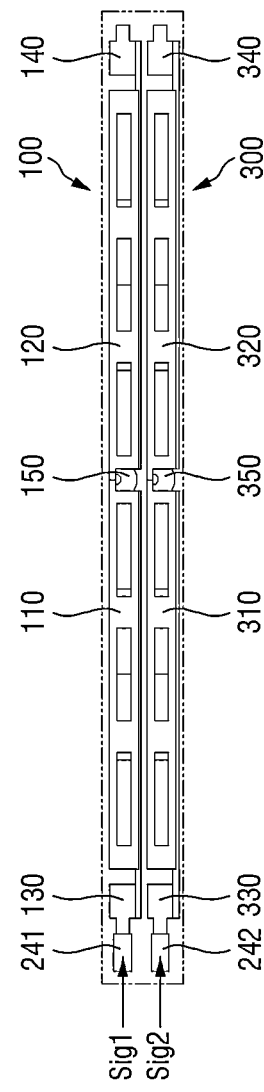

Referring to FIGS. 12 and 13, a plurality of test boards including the first test board 100 and the second test board 300 may be mounted on or placed in the main body 200 in a first mode (Mode1). The first test board 100 and the second test board 300 may be spaced apart in the third direction Z and mounted on or placed in the main body 200.

In the first mode (Mode 1), the first test board 100 may be mounted on or placed in the main body 200 with the first hinge portion 150 unfolded. That is, the first test board 100 may be mounted on or placed in the main body 200, while the first region 110 and the second region 120 are connected or oriented at an angle of 180 degrees.

Similarly, in the first mode (Mode 1), the second test board 300 may be mounted on or placed in the main body 200 with the second hinge portion 350 unfolded. That is, the second test board 300 may be mounted on or placed in the main body 200, while the third region 310 of the second test board 300 and the fourth region 320 of the second test board 300 are connected or oriented at an angle of 180 degrees.

The first region 110 of the first test board 100 and the third region 310 of the second test board 300 may be disposed adjacent to each other in the third direction Z in the first mode (Mode 1). The second region 120 of the first test board 100 and the fourth region 320 of the second test board 300 may be disposed adjacent to each other in the third direction Z in the first mode (Mode 1).

The first connector 130 may be connected to the first system connector 241. The second connector 140 may not be connected to an external device at a position opposite to the first connector 130.

In the first mode (Mode 1), the first signal (Sig1) may be provided to the first test board 100 through the first system connector 241. The test target device mounted on or placed in the first region 110 and the test target device mounted on or placed in the second region 120 may be tested through the first signal (Sig1) provided through the first system connector 241. For example, the test target device connected to the first test socket 111 of the first region 110 and the test target device connected to the second test socket 121 of the second region 120 may be tested, using the first signal (Sig1). The test target device connected to the first test socket 111 and the test target device connected to the second test socket 121 may be tested sequentially, using the first signal (Sig1).

In the first mode (Mode 1), the first region 110 and the second region 120 may be electrically connected. For example, both the first test socket 111 and the second test socket 121 may be electrically connected to the first connector 130. The first signal (Sig1) provided through the first system connector 241 and the first connector 130 may be provided to both the first test socket 111 and the second test socket 121. Therefore, the first signal (Sig1) provided through the first system connector 241 and the first connector 130 may be provided sequentially to the test target device connected to the first test socket 111 and the test target device connected to the second test socket 121.

The third connector 330 may be connected to the second system connector 242. The fourth connector 340 may not be connected to an external element at a position opposite to the third connector 330.

In the first mode (Mode1), the second signal (Sig2) may be provided to the second test board 300 through the second system connector 242. The test target device mounted on or placed in the third region 310 and the test target device mounted on or placed in the fourth region 320 may be tested by the second signal (Sig2) provided through the second system connector 242. For example, the test target device connected to the test socket of the third region 310 and the test target device connected to the test socket of the fourth region 320 may be tested, using the second signal (Sig2). The test target device connected to the test socket of the third region 310 and the test target device connected to the test socket of the fourth region 320 may be tested sequentially, using the second signal (Sig2).

In the first mode (Mode 1), the third region 310 and the fourth region 320 may be electrically connected. For example, both the test socket of the third region 310 and the test socket of the fourth region 320 may be electrically connected to the third connector 330. The second signal (Sig2) provided through the second system connector 242 and the third connector 330 may be provided to both the test socket of the third region 310 and the test socket of the fourth region 320. The second signal (Sig2) provided through the second system connector 242 and the third connector 330 may be sequentially provided to the test target device connected to the test socket of the third region 310 and to the test target device connected to the test socket of the fourth region 320.

Figure 14:
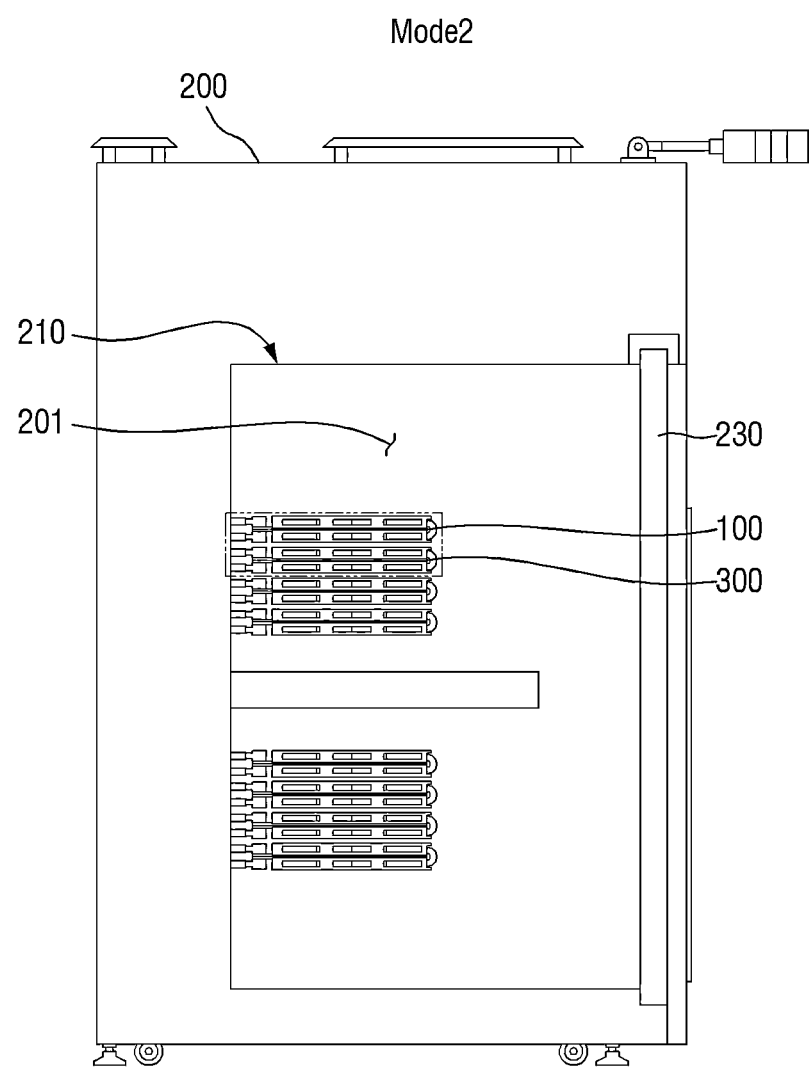
Figure 15:
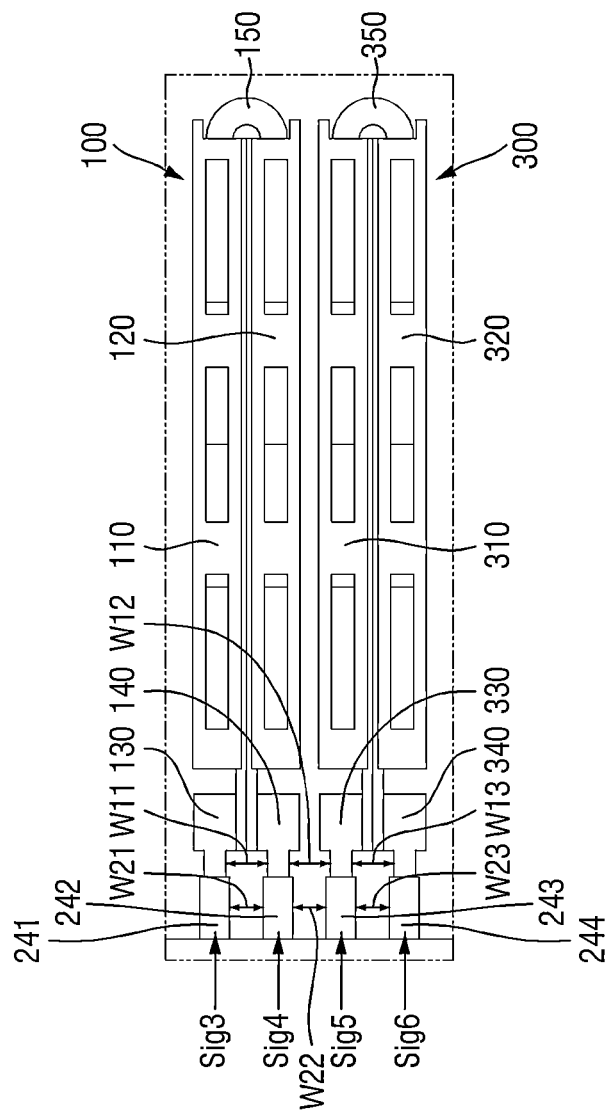

Referring to FIGS. 14 and 15, in the second mode (Mode2), the first test board 100 may be mounted on or placed in the main body 200 with the first hinge portion 150 completely folded. That is, the first test board 100 may be mounted on or placed in the main body 200, while the first region 110 and the second region 120 are connected or oriented at an angle of 0 degree.

Similarly, in the second mode (Mode2), the second test board 300 may be mounted on or placed in the main body 200 with the second hinge portion 350 completely folded. That is, the second test board 300 may be mounted on or placed in the main body 200, while the third region 310 of the second test board 300 and the fourth region 320 of the second test board 300 are connected or oriented at an angle of 0 degree.

The first region 110 of the first test board 100 and the second region 120 of the first test board 100 may be disposed adjacent to each other in the third direction Z in the second mode (Mode2). The second region 120 of the first test board 100 and the third region 310 of the second test board 300 may be disposed adjacent to each other in the third direction Z. The third region 310 of the second test board 300 and the fourth region 320 of the second test board 300 may be disposed adjacent to each other in the third direction Z.

The first to fourth connectors 130, 140, 330 and 340 may be disposed to be spaced apart in the third direction Z in the second mode (Mode2). The first connector 130 and the second connector 140 may be disposed parallel to each other in the third direction Z. The third connector 330 and the fourth connector 340 of the second test board 300 may be disposed parallel to each other in the third direction Z.

The distance by which the first to fourth connectors 130, 140, 330 and 340 are spaced apart in the third direction Z may correspond to a distance by which the first to fourth system connectors 241 to 244 are spaced apart in the third direction Z. The first system connector 241 and the second system connector 242 may be spaced apart by an interval W21. The first connector 130 and the second connector 140 may be spaced apart by an interval W11. The interval W11 may correspond to the interval W21.

The second system connector 242 and the third system connector 243 may be spaced apart by an interval W22. The second connector 140 and the third connector 330 may be spaced apart by an interval W12. The interval W12 may correspond to the interval W22.

The third system connector 243 and the fourth system connector 244 may be spaced apart by an interval W23. The third connector 330 and the fourth connector 340 may be spaced apart by an interval W13. The interval W13 may correspond to the interval W23.

The interval W21, the interval W22, and the W23 may be equal to each other. The interval W11, the interval W12, and the interval W13 may be equal to each other. That is, when the first test board 100 and the second test board 300 are mounted on or placed in the main body 200 in the folded state, the distance by which the first connector 130 and the second connector 140 are spaced apart may be equal to the distance by which the second connector 140 of the first test board 100 and the third connector 330 of the second test board 300 are spaced apart. Similarly, when the first test board 100 and the second test board 300 are mounted on or placed in the main body 200 in the folded state, the distance by which the first connector 330 and the fourth connector 340 are spaced apart may be equal to the distance by which the second connector 140 of the first test board 100 and the third connector 330 of the second test board 300 are spaced apart.

The first connector 130 may be connected to the first system connector 241. The second connector 140 may connected to the second system connector 242.

In the second mode (Mode2), a third signal (Sig3) may be provided to the first test board 100 through the first system connector 241. The test target device mounted on or placed in the first region 110 may be tested by the third signal (Sig3) provided through the first system connector 241. For example, the test target device connected to the first test socket 111 of the first region 110 may be tested, using the third signal (Sig3).

In the second mode (Mode 2), a fourth signal (Sig4) may be provided to the first test board 100 through the second system connector 242. The test target device mounted on or placed in the second region 120 may be tested by the fourth signal (Sig4) provided through the second system connector 242. For example, the test target device connected to the second test socket 121 of the second region 120 may be tested, using the fourth signal (Sig4).

The test of the test target device of the first region 110 using the third signal (Sig3) and the test of the test target device of the second region 120 using the fourth signal (Sig4) may be performed at the same time. The test target device connected to the first test socket 111 and the test target device connected to the second test socket 121 may be tested at the same time, using the third signal (Sig3) and the fourth signal (Sig4). That is, the test target device connected to the first test socket 111 and the test target device connected to the second test socket 121 mounted on or placed in the same first test board 100 each may be tested in parallel using different electric signals, without being sequentially tested.

In the second mode (Mode2), the first region 110 and the second region 120 may not be electrically connected. For example, only the first test socket 111 may be electrically connected to the first connector 130, and the second test socket 121 may not be electrically connected to the first connector 130. Also, only the second test socket 121 may be connected to the second connector 140, and the first test socket 111 may not be electrically connected to the second connector 140.

Therefore, the third signal (Sig3) provided through the first system connector 241 and the first connector 130 is provided only to the first test socket 111, and may not be provided to the second test socket 121. Similarly, the fourth signal (Sig4) provided through the second system connector 242 and the second connector 140 is provided only to the second test socket 121, and may not be provided to the first test socket 111.

The third connector 330 may be connected to the third system connector 243. The fourth connector 340 may be connected to the fourth system connector 244.

Similarly, in the second mode (Mode2), a fifth signal (Sig5) and a sixth signal (Sig6) may be provided to the second test board 300 through the third system connector 243 and the fourth system connector 244.

The test target device mounted on or placed in the third region 310 may be tested by the fifth signal (Sig5) provided through the third system connector 243. The test target device mounted on or placed in the fourth region 320 may be tested by the sixth signal (Sig6) provided through the fourth system connector 244.

The test of the test target device of the third region 310 using the fifth signal (Sig5) and the test of the test target device of the fourth region 320 using the sixth signal (Sig6) may be performed at the same time. That is, the test target device of the third region 310 and the test target device of the fourth region 320 mounted on or placed in the same second test board 300 may each be tested in parallel using different electrical signals, without being tested sequentially.

In the second mode (Mode2), the third region 310 and the fourth region 320 may not be electrically connected. For example, only the test socket of the third region 310 may be electrically connected to the third connector 330, and the test socket of the fourth region 320 may not be electrically connected to the third connector 330. Also, only the test socket of the fourth region 320 may be connected to the fourth connector 340, and the test socket of the third region 310 may not be electrically connected to the fourth connector 340.

Therefore, the fifth signal (Sig5) provided through the third system connector 243 and the third connector 330 may be provided only to the test socket of the third region 310 and may not be provided to the test socket of the fourth region 320. Similarly, the sixth signal (Sig6) provided through the fourth system connector 244 and the fourth connector 340 is provided only to the test socket of the fourth region 320, and may not be provided to the test socket of the third region 310.

In the second mode (Mode 2), since the first test board 100 is mounted in the state of being completely folded by the first hinge portion 150, the characteristics of the signal provided to the first test socket 111 of the first region 110 and the second test socket 121 of the second region 120 may be improved.

For example, when the first test board 100 is in the unfolded state, the signals provided to the second test socket 121 of the second region 120 are sequentially provided after provided to the first test socket 111 of the first region 110. On the other hand, in the state in which the first test board 100 is completely folded, since the signal provided to the second test socket 121 of the second region 120 is immediately provided to the second test socket 121 of the second region 120 without passing through the first region 110, the length of the signal can be shortened. Accordingly, since the noise of the signal is reduced, the reliability of the test can be improved.

Referring to FIGS. 12 to 15 again, the signal provided through the plurality of system connectors 240 in the first mode (Mode 1) and the signals provided through the plurality of system connectors 240 in the second mode (Mode 2) may have different electrical properties. For example, the signals provided to the test boards 100 and 300 in the first mode (Mode1) may be longer than the signals provided to the test boards 100 and 300 in the second mode (Mode2).

Figure 16:
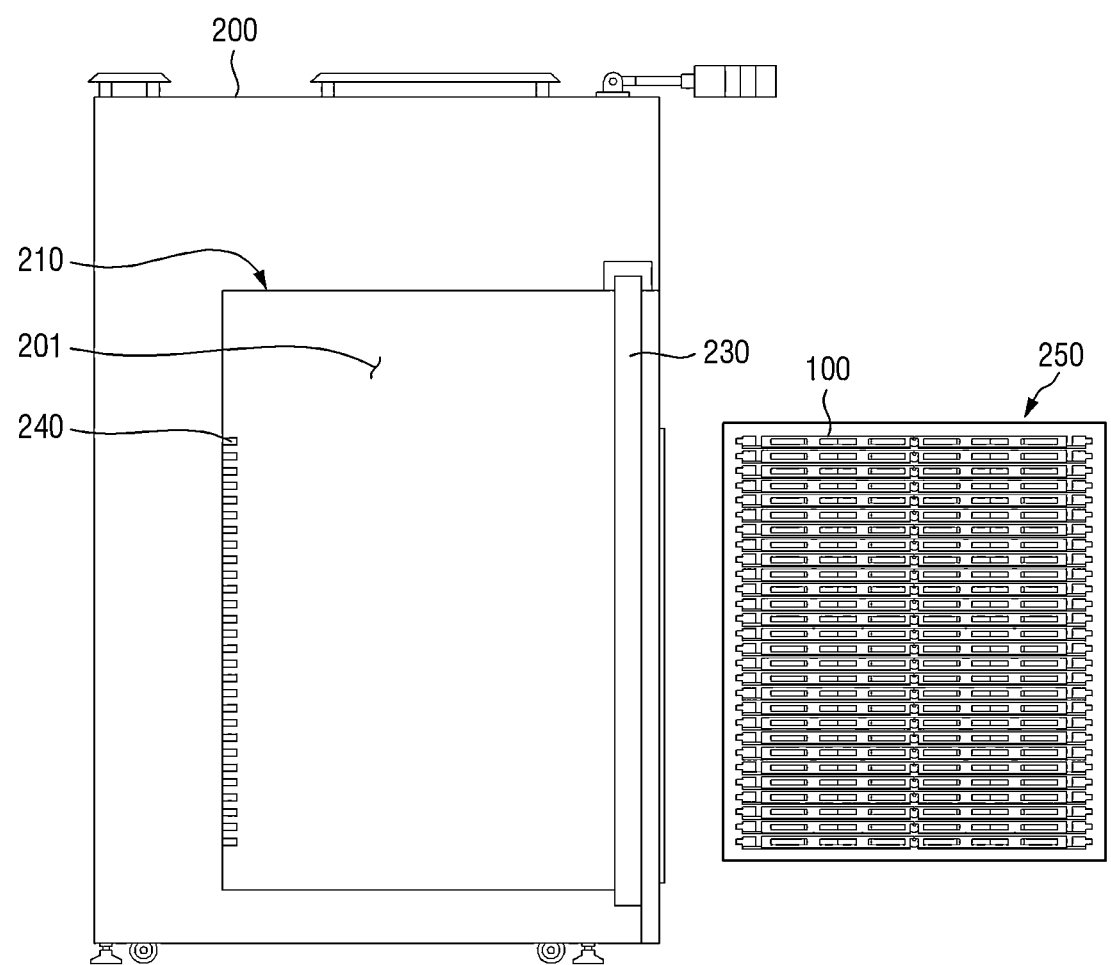
FIG. 16 is a diagram for explaining a test device according to some other example embodiments.

FIG. 16 is a diagram for explaining a test device according to some other example embodiments.

Referring to FIG. 16, the test device according to some example embodiments may further include a rack 250. The rack 250 may mount the plurality of test boards 100. The rack 250 may be inserted into the chamber 210 of the main body 200. The plurality of test boards 100 may be stacked inside the rack 250. The plurality of test boards 100 may be connected to the plurality of system connectors 240 while being mounted on or placed in the rack 250.

Since the plurality of test boards 100 are mounted in the chamber 210 while being stacked in the rack 250, a plurality of support guides 220 for supporting the plurality of test boards 100 may not be disposed inside the chamber 210.

In concluding the detailed description, those skilled in the art will appreciate that many variations and modifications may be made to the preferred example embodiments without substantially departing from the principles of the present inventive concepts. Therefore, the disclosed preferred example embodiments of the inventive concepts are used in a generic and descriptive sense only and not for purposes of limitation.

What is claimed is:

1. A test board comprising:
 a first region which includes a first upper surface with first test sockets aligned thereon, and a first lower surface opposite to the first upper surface;
 a second region which includes a second upper surface with second test sockets aligned thereon, and a second lower surface opposite to the second upper surface;
 a hinge portion between the first region and the second region, and configured to connect the first region and the second region such that the first region and the second region are folded or unfolded;
 a first connector at one end of the first region opposite to the hinge portion; and
 a second connector at one end of the second region opposite to the hinge portion.

2. The test board of claim 1,
wherein the number of first test sockets is the same as the number of second test sockets.

3. The test board of claim 1,
wherein the first test socket includes a fixing member which fixes a test target device connected to the first test socket.

4. The test board of claim 1,
wherein in a state in which the first region and the second region are folded,
the first upper surface and the second upper surface are spaced apart in a first direction, and the first lower surface and the second lower surface overlap.

5. The test board of claim 4,
wherein the first connector is electrically connected to the first test socket and not electrically connected to the second test socket.

6. The test board of claim 4,
wherein the first connector and the second connector are spaced apart to be parallel to each other in the first direction.

7. The test board of claim 1,
wherein in a state in which the first region and the second region are unfolded,
the first upper surface and the second upper surface are in contact with each other and oriented flat, and the first lower surface and the second lower surface are spaced apart from each other.

8. The test board of claim 7,
wherein the first connector is electrically connected to the first test socket and the second test socket.

9. The test board of claim 7,
wherein the first connector and the second connector are symmetrical with respect to the hinge portion.

10. The test board of claim 1,
wherein the hinge portion includes a flexible printed circuit board (FPCB).

11. The test board of claim 1,
wherein the first connector includes a plurality of first sub-connectors,
the second connector includes a plurality of second sub-connectors, and
the number of the plurality of first sub-connectors is the same as the number of the plurality of second sub-connectors.

12. A test board comprising:
a first region in which first test sockets are aligned;
a second region in which second test sockets are aligned;
a hinge portion between the first region and the second region, configured to change an angle between the first region and the second region, and configured to connect the first region and the second region;
a first connector at one end of the first region opposite to the hinge portion; and
a second connector at one end of the second region opposite to the hinge portion,
wherein the angle between the first region and the second region is 0 degree or more and 180 degrees or less,
the first connector is selectively connected to the second test sockets, and
the second connector is selectively connected to the first test sockets.

13. The test board of claim 12,
wherein in a state in which the angle between the first region and the second region is 0 degree,
a first upper surface of the first region and a second upper surface of the second region are spaced apart from each other, and a first lower surface of the first region and a second lower surface of the second region are in contact with each other, and
the first connector is electrically connected to the first test socket and not electrically connected to the second test socket.

14. The test board of claim 13,
wherein in a state in which the angle between the first region and the second region is 180 degrees,
the first upper surface of the first region and the second upper surface of the second region are in contact with each other and oriented flat, and the first lower surface of the first region and the second lower surface of the second region are spaced apart from each other, and
the first connector is electrically connected to the first test socket and the second test socket.

15. The test board of claim 14,
wherein the first connector and the second connector are symmetrical with respect to the hinge portion.

16. The test board of claim 14,
wherein the first upper surface and the second upper surface are connected in a first direction,
a first interval at which the first test sockets are spaced apart in the first direction is the same as a second interval at which the second test sockets are spaced apart in the first direction,
the first test sockets include a first sub-test socket closest to the second region,
the second test sockets include a second sub-test socket closest to the first region, and
a third interval at which the first sub-test socket and the second sub-test socket are spaced apart in the first direction is greater than the first interval.

17. A test device comprising:
a main body which includes a chamber configured to test a plurality of test target devices; and
a test board configured to support the plurality of test target devices and mounted inside the chamber,
wherein the test board includes
a first region in which first test sockets connected to the test target devices are aligned,
a second region in which second test sockets connected to the test target devices are aligned,
a hinge portion between the first region and the second region, and configured to connect the first region and the second region such that the first region and the second region are folded or unfolded,
a first connector at one end of the first region opposite to the hinge portion, and
a second connector at one end of the second region opposite to the hinge portion.

18. The test device of claim 17, further comprising:
a first system connector and a second system connector disposed inside the chamber and spaced apart in a first direction at a first interval,
wherein in a state in which the first region and the second region are folded,
the first region and the second region overlap in the first direction, and the first connector and the second connector are spaced apart at the first interval in the first direction and disposed parallel to each other,
the first connector is connected to the first system connector, and
the second connector is connected to the second system connector.

19. The test device of claim 17,
wherein in a first test mode,
the test board is mounted in the chamber with the first region and the second region unfolded, and
a test target device connected to the first test socket and a test target device connected to the second test socket are sequentially tested, using electrical signals provided to the test board through the first test socket.

20. The test device of claim 17,
wherein in a second test mode,
the test board is mounted inside the chamber with the first region and the second region folded,
a test target device connected to the first test socket is tested, using a first signal provided to the test board through the first test socket,
a test target device connected to the second test socket is tested, using a second signal provided to the test board through the second test socket, and
the test target device connected to the first test socket and the test target device connected to the second test socket are tested simultaneously.

\* \* \* \* \*